(12) United States Patent
Liu

(10) Patent No.: US 10,007,175 B2
(45) Date of Patent: Jun. 26, 2018

(54) MASK AND METHOD FOR MANUFACTURING THIN FILM TRANSISTOR USING THE SAME

(71) Applicant: BOE TECHNOLOGY GROUP CO., LTD., Beijing (CN)

(72) Inventor: Xiang Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 76 days.

(21) Appl. No.: 15/126,955

(22) PCT Filed: Sep. 22, 2015

(86) PCT No.: PCT/CN2015/090252
§ 371 (c)(1),
(2) Date: Sep. 16, 2016

(87) PCT Pub. No.: WO2016/145814
PCT Pub. Date: Sep. 22, 2016

(65) Prior Publication Data
US 2017/0110490 A1    Apr. 20, 2017

(30) Foreign Application Priority Data

Mar. 19, 2015 (CN) .......................... 2015 1 0122578

(51) Int. Cl.
| | | |
|---|---|---|
| *G03F 1/38* | (2012.01) | |
| *G03F 7/039* | (2006.01) | |
| *H01L 27/12* | (2006.01) | |
| *H01L 29/24* | (2006.01) | |
| *H01L 29/66* | (2006.01) | |
| *H01L 29/417* | (2006.01) | |

(52) U.S. Cl.
CPC ................ *G03F 1/38* (2013.01); *G03F 7/039* (2013.01); *H01L 27/127* (2013.01); *H01L 27/1288* (2013.01); *H01L 29/24* (2013.01); *H01L 29/41733* (2013.01); *H01L 29/66969* (2013.01)

(58) Field of Classification Search
CPC .................................. G03F 1/38; G03F 7/039
USPC ............................................. 430/5, 313, 320
See application file for complete search history.

(56) References Cited

U.S. PATENT DOCUMENTS 7,803,503 B2 * 9/2010 Yamayoshi ............... G03F 1/50
430/5
2008/0107972 A1    5/2008 Yamayoshi

FOREIGN PATENT DOCUMENTS

| CN | 103000628 A | 3/2013 |
|---|---|---|
| CN | 104716026 A | 6/2015 |
| KR | 20080054176 A | 6/2008 |
| KR | 101328852 B1 | 11/2013 |

OTHER PUBLICATIONS

International Search Report and Written Opinion (including English translation of Box V) dated Dec. 18, 2015, for corresponding PCT Application No. PCT/CN2015/090252.
First Chinese Office Action including English translation dated Feb. 23, 2017, for corresponding Chinese Application No. 201510122578.9.

* cited by examiner

*Primary Examiner* — Christopher G Young
(74) *Attorney, Agent, or Firm* — Kinney & Lange, P.A.

(57) ABSTRACT

A mask and a method for manufacturing a thin film transistor of a pixel area of an array substrate using the mask are disclosed. The mask comprises a mask body having a pattern area. The pattern area includes a photoresist partially removing area for removing photoresist partially; a photoresist completely removing area for removing photoresist completely and a first photoresist reserving area located between the photoresist partially removing area and the photoresist completely removing area and adjoining the photoresist partially removing area and the photoresist completely removing area for reserving photoresist, the first photoresist reserving area being designed to adjust a profile of a part of the photoresist corresponding to the photoresist partially removing area after exposure and development.

15 Claims, 10 Drawing Sheets

MASK AND METHOD FOR MANUFACTURING THIN FILM TRANSISTOR USING THE SAME

CROSS-REFERENCE TO RELATED APPLICATION

This application claims the benefit of Chinese Patent Application No. 201510122578.9 filed on Mar. 19, 2015 in the State Intellectual Property Office of China, the whole disclosure of which is incorporated herein by reference.

TECHNICAL FIELD

The embodiments of the present disclosure relate to a mask and a method for manufacturing a thin film transistor using the same.

BACKGROUND

When manufacturing thin film transistors (TFT) of pixel areas of an array substrate, a profile of a part of photoresist corresponding to a photoresist partially removing area obtained after exposure and development with a conventional halftone or gray tone mask is quite different from a designed profile, for example, actual dimensions of the obtained profile are quite different from designed dimensions, which has an adverse effect on the quality of TFTs of pixel areas of the array substrate.

SUMMARY

Accordingly, it is an object of the present disclosure to provide a mask and a method for manufacturing thin film transistor using the mask, such that a profile of a part of photoresist corresponding to the photoresist partially removing area after exposure and development is improved.

According to an embodiment of the present disclosure, there is provided a mask comprising a mask body having a pattern area, the pattern area comprises: a photoresist partially removing area for removing photoresist partially; a photoresist completely removing area for removing photoresist completely; and a first photoresist reserving area located between the photoresist partially removing area and the photoresist completely removing area and adjoining the photoresist partially removing area and the photoresist completely removing area for reserving photoresist, the first photoresist reserving area being designed to adjust a profile of a part of photoresist corresponding to the photoresist partially removing area after exposure and development.

According to an embodiment of the present disclosure, the pattern area further comprises a second photoresist reserving area, and the photoresist partially removing area is arranged between the first and second photoresist reserving areas.

According to an embodiment of the present disclosure, the pattern area comprises two photoresist partially removing areas, two first photoresist reserving areas, and two photoresist completely removing areas, the pattern area further comprises a second photoresist reserving area, the two photoresist completely removing areas, the two first photoresist reserving areas, the two photoresist partially removing areas and the second photoresist reserving area are arranged in a row in an order of one of the two photoresist completely removing areas, one of the two first photoresist reserving areas, one of the two photoresist partially removing areas, the second photoresist reserving area, the other of the two photoresist partially removing areas, the other of the two first photoresist reserving areas, the other of the two photoresist completely removing areas.

According to an embodiment of the present disclosure, the pattern area of the mask is configured to form a thin film transistor of a pixel area of an array substrate, and the thin film transistor comprises a metal oxide semiconductor layer, a source electrode and a drain electrode; the metal oxide semiconductor layer has contact parts for contacting a part of the source electrode and a part of the drain electrode respectively, wherein the photoresist partially removing areas correspond to the contact parts, and the photoresist completely removing areas and the first photoresist reserving areas correspond to at least a part of an area around the thin film transistor of each pixel area of the array substrate; or the photoresist partially removing areas and the first photoresist reserving areas correspond to the contact parts, and the photoresist completely removing areas correspond to at least a part of an area around the thin film transistor of each pixel area of the array substrate; or the photoresist partially removing areas and parts of adjacent first photoresist reserving areas correspond to the contact parts, and the photoresist completely removing areas and the rest of the adjacent first photoresist reserving areas correspond to at least a part of an area around the thin film transistor of each pixel area of the array substrate.

According to an embodiment of the present disclosure, the pattern area of the mask is configured to form a thin film transistor of a pixel area of an array substrate, and the thin film transistor comprises a source electrode and a drain electrode; a metal oxide semiconductor layer having contact parts for contacting a part of the source electrode and a part of the drain electrode respectively, and an etching blocking layer located in a channel area between the source electrode and the drain electrode and on the metal oxide semiconductor layer, wherein the second photoresist reserving area corresponds to the etching blocking layer of the thin film transistor of the array substrate, and wherein, the photoresist partially removing areas correspond to the contact parts, and the photoresist completely removing areas and the first photoresist reserving areas correspond to at least a part of an area around the thin film transistor of each pixel area of the array substrate; or the photoresist partially removing areas and the first photoresist reserving areas correspond to the contact parts, and the photoresist completely removing areas correspond to at least a part of an area around the thin film transistor of each pixel area of the array substrate; or the photoresist partially removing areas and parts of adjacent first photoresist reserving areas correspond to the contact parts, and the photoresist completely removing areas and the rest of the adjacent first photoresist reserving areas correspond to at least a part of an area around the thin film transistor of each pixel area of the array substrate.

According to an embodiment of the present disclosure, the first photoresist reserving area has a length of 0.5-6 μm.

According to an embodiment of the present disclosure, the first photoresist reserving area has a length of 1-3 μm.

According to an embodiment of the present disclosure, the first photoresist reserving area has a transmittance which substantially equals to that of the second photoresist reserving area.

According to an embodiment of the present disclosure, the photoresist completely removing area has a length which is at least 20 times of the length of the first photoresist reserving area.

According to an embodiment of the present disclosure, the first photoresist reserving area is designed such that a difference between a dimension of a part of photoresist which corresponds to the photoresist partially removing area after exposure and development and a designed dimension is less than a predetermined value, and/or a difference between a position of the part of photoresist which corresponds to the photoresist partially removing area after exposure and development and a designed position is less than a predetermined value.

According to an embodiment of the present disclosure, the first photoresist reserving areas is designed such that a part of photoresist which corresponds to the photoresist partially removing area after exposure and development meets a predetermined dimensional tolerance, a predetermined profile tolerance and/or a predetermined position tolerance.

According to an embodiment of the present disclosure, for positive photoresist, the first photoresist reserving areas form opaque areas, the photoresist completely removing area forms a light-transmitting area and the photoresist partially removing area forms a semitransparent area.

According to an embodiment of the present disclosure, for positive photoresist, the first and second photoresist reserving areas form opaque areas, the photoresist completely removing area forms a light-transmitting area and the photoresist partially removing area forms a semitransparent area.

According to an embodiment of the present disclosure, for positive photoresist, the first photoresist reserving area has a transmittance which is less than or equals to 10%.

According to an embodiment of the present disclosure, there is provided a method for manufacturing thin film transistors of pixel areas of an array substrate using the mask according to claim 2, comprising steps of: forming a layer of photoresist on a plurality of layers for creating a thin film transistor, the plurality of layers comprising a metal oxide semiconductor layer and the etching blocking layer provided on it, and exposing the photoresist layer with the mask, wherein the second photoresist reserving area corresponds to an etching blocking layer of the thin film transistors of the array substrate, and wherein the photoresist partially removing area corresponds to the contact parts, and the photoresist completely removing area and the first photoresist reserving area correspond to at least a part of an area around the thin film transistor of each pixel area of the array substrate; or the photoresist partially removing area and the first photoresist reserving area correspond to the contact parts, and the photoresist completely removing area corresponds to at least a part of an area around the thin film transistor of each pixel area of the array substrate; or the photoresist partially removing area and a part of adjacent first photoresist reserving area correspond to the contact parts, and the photoresist completely removing area and the rest of the adjacent first photoresist reserving area correspond to at least a part of an area around the thin film transistor of each pixel area of the array substrate.

With technical solution of the present disclosure, the profile of the part of photoresist corresponding to the photoresist partially removing areas after exposure and development is improved.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF PREFERRED EMBODIMENTS OF THE INVENTION

Exemplary embodiments of the present disclosure will be described hereinafter in detail with reference to the attached drawings. Many details are set forth in the following description to provide a thorough understanding of the embodiments of the present disclosure. The present disclosure may, however, be implemented without those details. In other circumstances, well-known structures and devices are illustrated so as to simplify the drawings.

Figure 1:
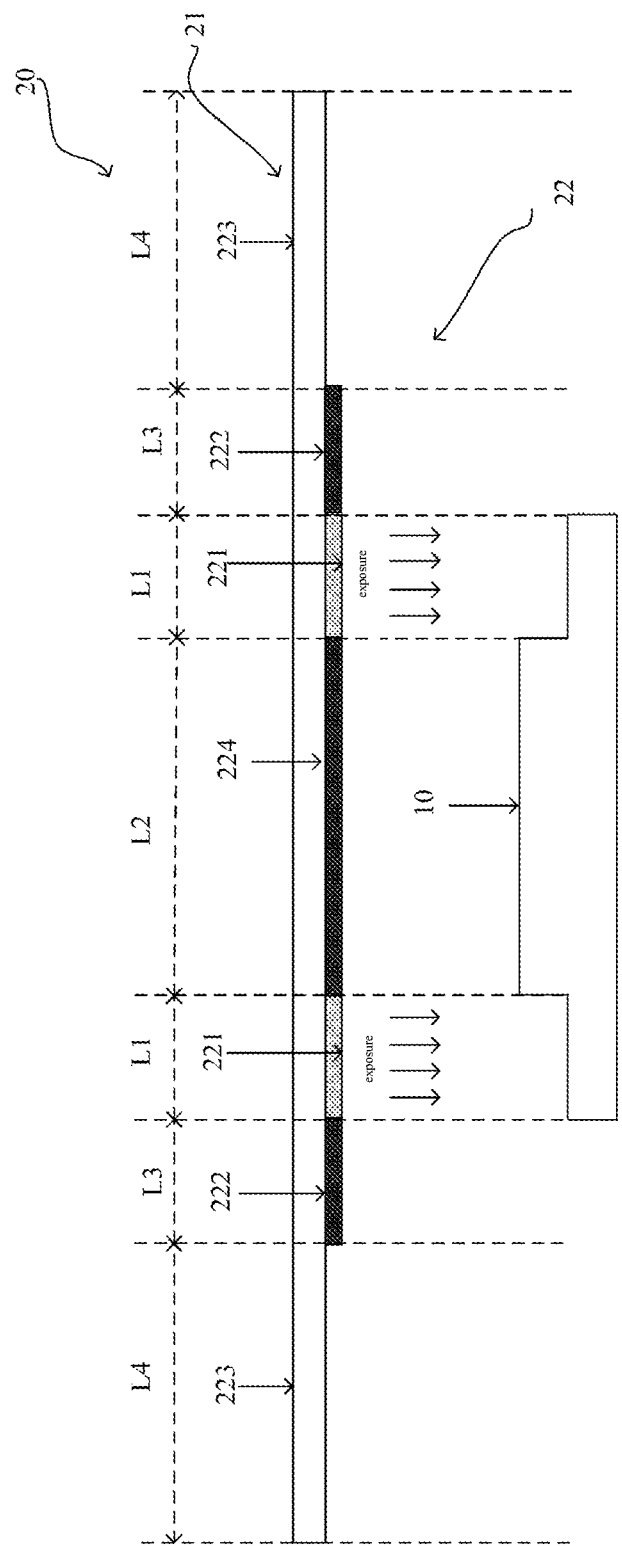
FIG. 1 is an illustrative view of a mask according to an embodiment of the present disclosure, in which a layer of photoresist after exposure and development is illustrated.

FIG. 1 shows a mask 20 according to an embodiment of the present disclosure. As shown in FIG. 1, the mask 20 according to the embodiment of the present disclosure has a mask body 21 having a pattern area 22. The pattern area 22 comprises: a photoresist partially removing area 221 for removing photoresist partially; a photoresist completely removing area 223 for removing photoresist completely; and a first photoresist reserving area 222 located between the photoresist partially removing area 221 and the photoresist completely removing area 223 and adjoining the photoresist partially removing area 221 and the photoresist completely removing area 223 for reserving photoresist, the first photoresist reserving area 222 being designed to adjust a profile of a part of the photoresist corresponding to the photoresist partially removing area 221 after exposure and development, such as, to improve the profile such that a difference between the profile and a designed profile is less than a predetermined level. For example, the first photoresist reserving area 222 is designed such that a difference between a dimension of a part of photoresist which corresponds to the photoresist partially removing area 221 after exposure and development and a designed dimension is less than a predetermined value and/or a difference between a position of the part of photoresist which corresponds to the photoresist partially removing area 221 after exposure and development and a designed position is less than a predetermined value; or for example, the first photoresist reserving area 222 is designed such that a part of photoresist which corresponds to the photoresist partially removing area 221 after exposure and development meets a predetermined dimensional tolerance, a predetermined profile tolerance and/or a predetermined position tolerance. Obviously, other parameters or values can be used to measure such a predetermined level.

Figure 2:
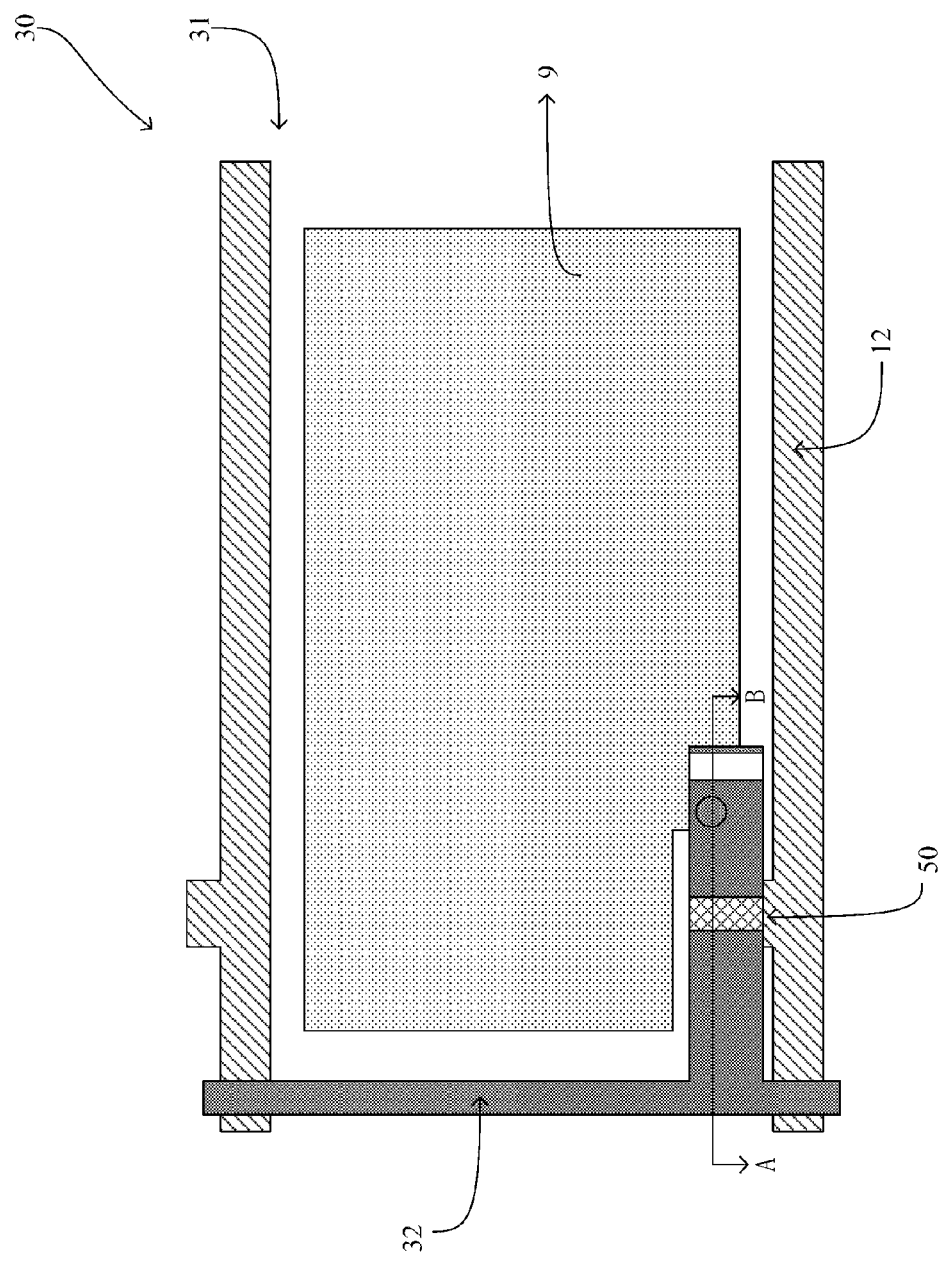
FIG. 2 is a plan view of an array substrate according to an embodiment of the present disclosure after formation of a TFT array is completed.

As shown in FIGS. 1 and 2, for example, the mask 20 may be formed by creating a pattern layer on a substrate of a material such as quartz. The mask 20 is a halftone or gray tone mask. The mask 20 may be designed to form TFTs 50 of pixel areas 31 of an array substrate 30 of a display device such as a liquid crystal display device, or to form an array substrate 30 of a display device such as a liquid crystal display device.

As shown in FIG. 1, according to some embodiments of the present disclosure, the pattern area 22 further comprises a second photoresist reserving area 224, and the photoresist partially removing area 221 is arranged between the first and second photoresist reserving areas 222, 224. For example, the first photoresist reserving area 222 has a transmittance which substantially equals to that of the second photoresist reserving area 224.

For positive photoresist, the first and second photoresist reserving areas 222, 224 form opaque areas, the photoresist completely removing area 223 forms a light-transmitting area and the photoresist partially removing area 221 forms a semitransparent area. According to an embodiment of the present disclosure, for example, for positive photoresist, the first photoresist reserving area 222 may have a transmittance which is less than or equals to 10%. For example, for positive photoresist, the first photoresist reserving area 222 may have a transmittance which is less than or equals to 5%.

For negative photoresist, the first and second photoresist reserving areas 222, 224 form completely light-transmitting areas, the photoresist completely removing area 223 forms an opaque area and the photoresist partially removing area 221 forms semitransparent areas. For example, for negative photoresist, the first photoresist reserving area 222 may have a transmittance which is greater than or equals to 90%. For example, for negative photoresist, the first photoresist reserving area 222 may have a transmittance which is greater than or equals to 95%.

Referring to FIG. 1, according to some other embodiments of the present disclosure, in the pattern area 22, there may be two photoresist partially removing areas 221, two first photoresist reserving areas 222, and two photoresist completely removing areas 223. The pattern area 22 further comprises a second photoresist reserving area 224. One of the two photoresist completely removing areas 223, one of the two first photoresist reserving areas 222, one of the two photoresist partially removing areas 221, the second photoresist reserving area 224, the other of the two photoresist partially removing areas 221, the other of the two first photoresist reserving areas 222, the other of the two photoresist completely removing areas 223 are arranged in a row in an order of the one of the two photoresist completely removing areas 223, the one of the two first photoresist reserving areas 222, the one of the two photoresist partially removing areas 221, the second photoresist reserving area 224, the other of the two photoresist partially removing areas 221, the other of the two first photoresist reserving areas 222, the other of the two photoresist completely removing areas 223.

Figure 10:
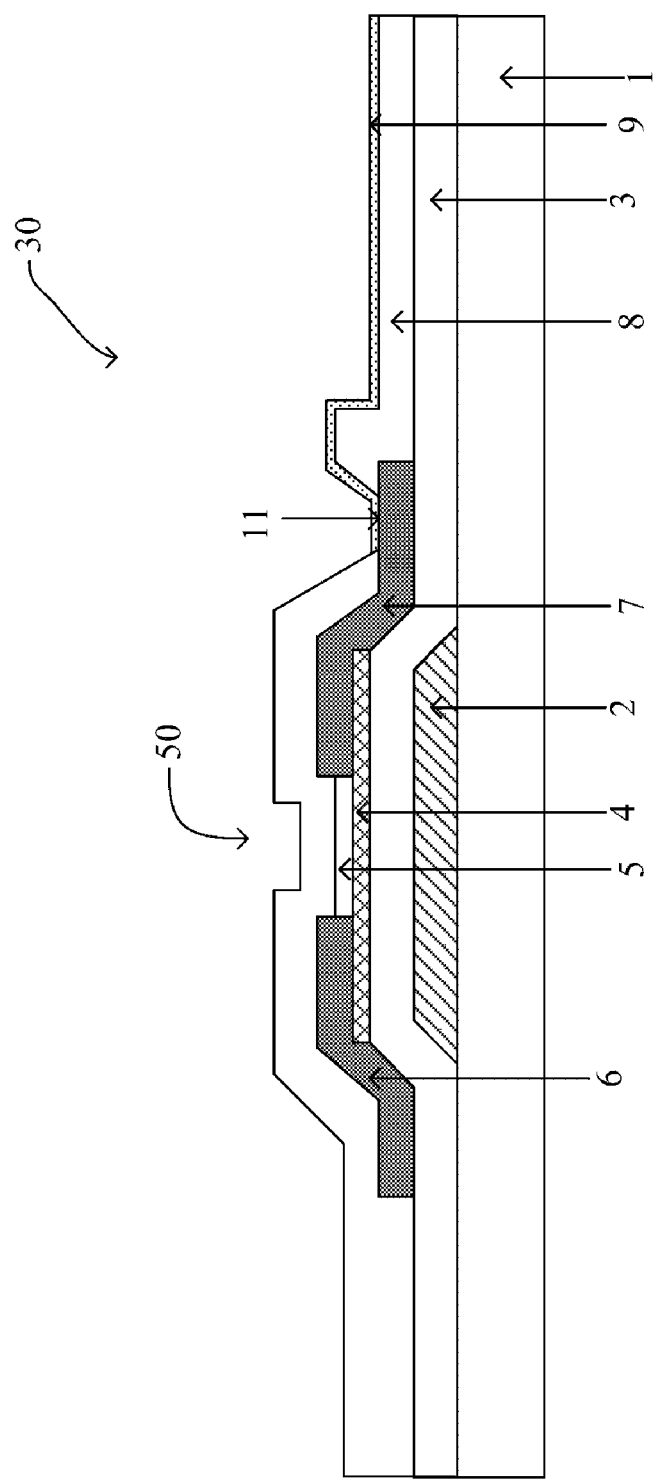
FIG. 10 is a sectional view taken along the line AB in FIG. 2, showing an array substrate after a fifth photolithography process according to an embodiment of the present disclosure, taken along the line AB in FIG. 2.

Referring to FIGS. 1, 2 and 10, according to some embodiments of the present disclosure, the pattern area 22 of the mask 20 is designed to form the thin film transistors 50 of the pixel areas 31 of the array substrate 30. Each thin film transistor 50 comprises a metal oxide semiconductor layer 4, a source electrode 6 and a drain electrode 7. The metal oxide semiconductor layer 4 has contact parts 41 for contacting a part of the source electrode 6 and a part of the drain electrode 7 respectively. The photoresist partially removing areas 221 correspond to the contact parts 41, and the photoresist completely removing areas 223 and the first photoresist reserving areas 222 correspond to at least a part of an area around the thin film transistor 50 of each pixel area 31 of the array substrate 30; or the photoresist partially removing areas 221 and the first photoresist reserving areas 222 correspond to the contact parts 41, and the photoresist completely removing areas 223 correspond to at least a part of an area around the thin film transistor 50 of each pixel area 31 of the array substrate 30; or the photoresist partially removing areas 221 and parts of adjacent first photoresist reserving areas 222 correspond to the contact parts 41, and the photoresist completely removing areas 223 and the rest of the adjacent first photoresist reserving areas 222 correspond to at least a part of an area around the thin film transistor 50 of each pixel area 31 of the array substrate 30.

Referring to FIGS. 1, 2 and 10, according to some other embodiments of the present disclosure, the pattern area 22 of the mask 20 is designed to form the thin film transistors 50 of the pixel areas 31 of the array substrate 30. Each thin film transistor 50 comprises: a metal oxide semiconductor layer 4; a source electrode 6 and a drain electrode 7, the metal oxide semiconductor layer 4 having contact parts 41 for contacting a part of the source electrode 6 and a part of the drain electrode 7 respectively; and an etching blocking layer 5 which is located in a channel area between the source electrode 6 and the drain electrode 7 and which is located on the metal oxide semiconductor layer 4. The second photoresist reserving area 224 corresponds to the etching blocking layer 5 of the thin film transistor 50 of the array substrate 30. The photoresist partially removing areas 221 correspond to the contact parts 41, and the photoresist completely removing areas 223 and the first photoresist reserving areas 222 correspond to at least a part of an area around the thin film transistor 50 of each pixel area 31 of the array substrate 30; or the photoresist partially removing areas 221 and the first photoresist reserving areas 222 correspond to the contact parts 41, and the photoresist completely removing areas 223 correspond to at least a part of an area around the thin film transistor 50 of each pixel area 31 of the array substrate 30; or the photoresist partially removing areas 221 and parts of adjacent first photoresist reserving areas 222 correspond to the contact parts 41, and the photoresist completely removing areas 223 and the rest of the adjacent first photoresist reserving areas 222 correspond to at least a part of an area around the thin film transistor 50 of each pixel area 31 of the array substrate 30.

As shown in FIG. 1, according to some embodiments of the present disclosure, in order to adjust the profile of the part of photoresist corresponding to the photoresist partially removing areas 221 after exposure and development, the photoresist partially removing areas 221 has a length L1 of 1-10 μm, for example 2-4 μm, and the second photoresist reserving area 224 has a length L2 of 2-20 μm, for example 2-8 μm. The first photoresist reserving area 222 has a length or width L3 of 0.5-6 μm, for example 1-3 μm. The photoresist completely removing area 223 outside the first photoresist reserving areas 222 has a length L4 which is much larger than L3, for example, L4>20*L3. That is, the length of the photoresist completely removing area 223 is at least 20 times of the length of the first photoresist reserving area 222.

A method for manufacturing the thin film transistor 50 of the pixel area 31 of the array substrate 30 using above described mask 100 according to an embodiment of the present disclosure will be described hereinafter.

Referring to FIGS. 1-10, the method includes steps of: forming a layer of photoresist 10 on a plurality of layers for creating a thin film transistor 50, the plurality of layers comprising a metal oxide semiconductor layer 4 and an etching blocking layer 5 provided on it; and exposing the photoresist layer 10 with the mask 100. The second photoresist reserving area 224 corresponds to the etching blocking layer 5 of the thin film transistors 50 of the array substrate 30. The photoresist partially removing area 221 corresponds to the contact parts 41, and the photoresist completely removing area 223 and the first photoresist reserving area 222 correspond to at least a part of an area around the thin film transistor 50 of each pixel area 31 of the array substrate 30; or the photoresist partially removing area 221 and the first photoresist reserving area 222 correspond to the contact parts 41, and the photoresist completely removing area 223 corresponds to at least a part of an area around the thin film transistor 50 of each pixel area 31 of the array substrate 30; or the photoresist partially removing area 221 and a part of adjacent first photoresist reserving area 222 correspond to the contact parts 41, and the photoresist completely removing area 223 and the rest of the adjacent first photoresist reserving area 222 correspond to at least a part of an area around the thin film transistor 50 of each pixel area 31 of the array substrate 30.

An example of a method for manufacturing the thin film transistor 50 of the pixel area 31 of the array substrate 30 using above described mask 100 according to an embodiment of the present disclosure will be described hereinafter.

Figure 3:
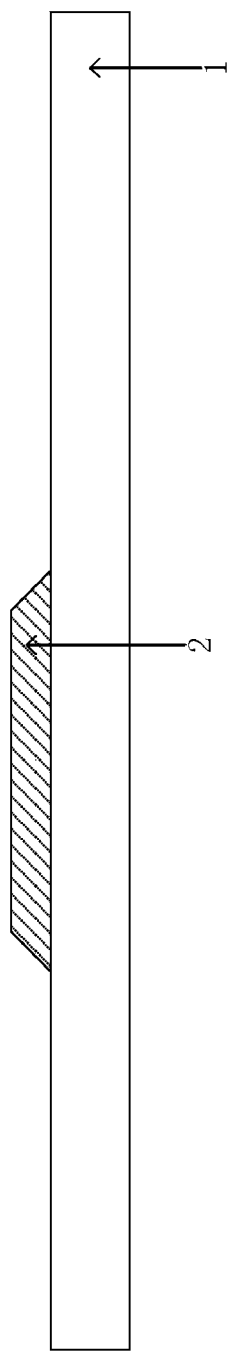
FIG. 3 is a sectional view taken along the line AB in FIG. 2, showing an array substrate after a first photolithography process according to an embodiment of the present disclosure.

In Step 1, as shown in FIG. 3, a gate metal film having a thickness of approximate 2000~10000 Å is deposited on a substrate 1 using a method of thermal evaporation or sputtering. Metal or alloy such as Cr, W, Cu, Ti, Ta, and Mo may be used for forming the gate metal film. A gate metal layer made of a plurality of layers of metals is also conceivable. Gate electrodes 2 and gate lines 12 (FIG. 2) are formed through a single photolithography process, as shown in FIG. 3.

Figure 4:
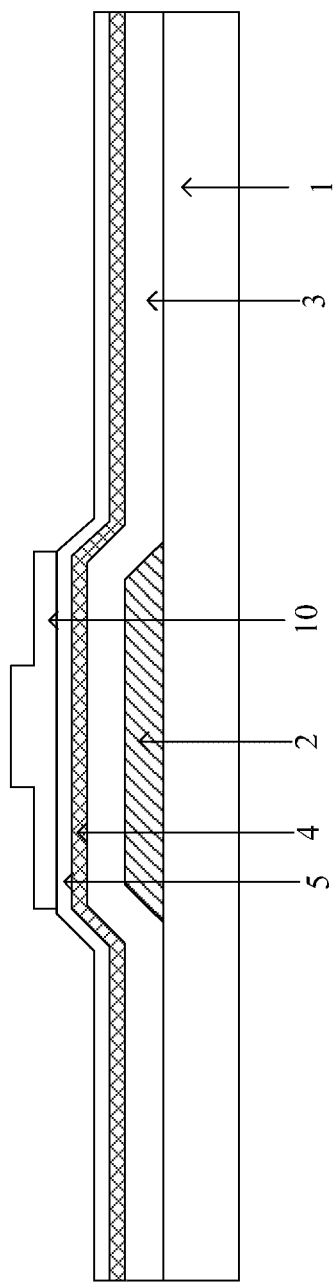
FIG. 4 is a sectional view taken along the line AB in FIG. 2, showing the array substrate after exposure and development of a second photolithography process according to an embodiment of the present disclosure.
Figure 5:
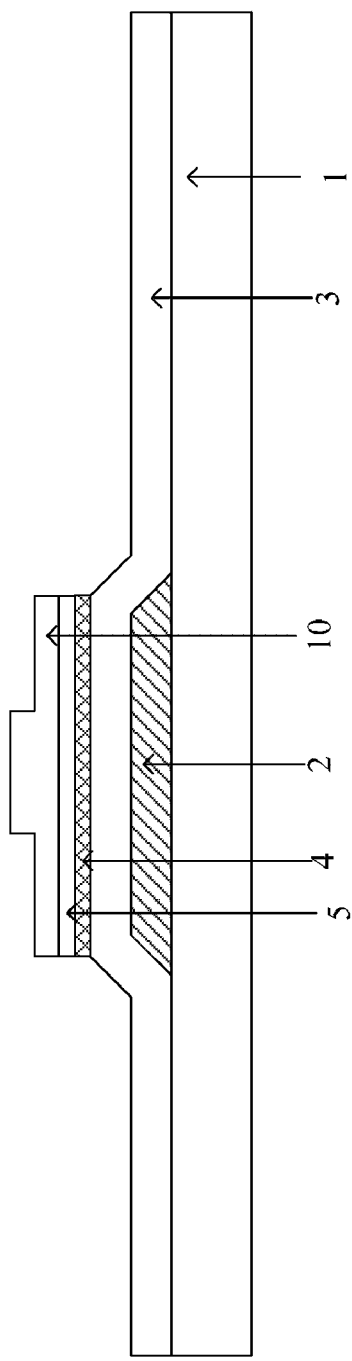
FIG. 5 is a sectional view taken along the line AB in FIG. 2, showing an array substrate after a first etching of the second photolithography process according to an embodiment of the present disclosure taken along the line AB in FIG. 2.
Figure 6:
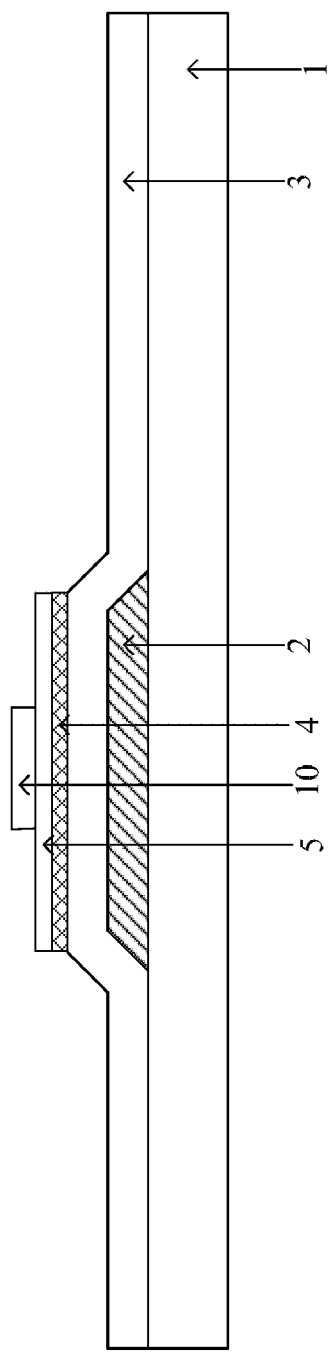
FIG. 6 is a sectional view taken along the line AB in FIG. 2, showing an array substrate after an ashing of the second photolithography process according to an embodiment of the present disclosure taken along the line AB in FIG. 2.
Figure 7:
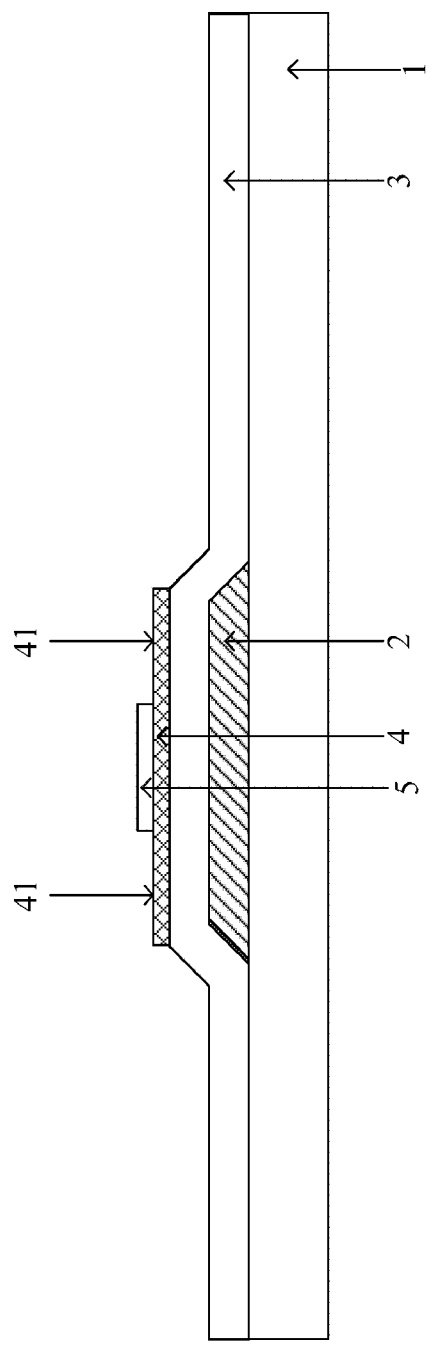
FIG. 7 is a sectional view taken along the line AB in FIG. 2, showing an array substrate after a second etching of the second photolithography process according to an embodiment of the present disclosure taken along the line AB in FIG. 2.

In Step 2, as shown in FIG. 4, a gate insulating layer 3 having a thickness of approximate 2000~8000 Å is continuously deposited on a substrate 1 through a PECVD process after the Step 1 is completed. An oxide, a nitride or an oxynitride may be used for forming the gate insulating layer 3. $SiH_4$, $N_2O$ are used as a reacting gas in the PECVD process to create silicon oxide. $SiH_4$, $NH_3$, $N_2$ or $SiH_2Cl_2$, $NH_3$, $N_2$ are used as a reacting gas in the PECVD process to create a nitride or an oxynitride. Then a metal oxide semiconductor layer 4 having a thickness of approximate 100~2000 Å is deposited on the gate insulating layer 4 through a thermal evaporation or sputtering process. The semiconductor layer may be formed of amorphous IGZO, HIZO, IZO, a-InZnO, a-InZnO, ZnO:F, $In_2O_3$:Sn, $In_2O_3$:Mo, $Cd_2SnO_4$, ZnO:Al, $TiO_2$:Nb, Cd—Sn—O or other metal oxide. Then an etching blocking layer 5 having a thickness of 500~4000 Å is deposited through a PECVD process. An oxide, a nitride or an oxynitride may be used for forming the etching blocking layer 5. $SiH_4$, $N_2O$ are used as the reacting gas to create silicon oxide. $SiH_4$, $NH_3$, $N_2$ or $SiH_2Cl_2$, $NH_3$, $N_2$ are used as the reacting gas to create a nitride or an oxynitride. The blocking layer may also be formed of $Al_2O_3$ or has a double-layer block structure. Finally, a photoresist layer 10 is formed. Then, exposure and development using the mask 20 are performed according to an embodiment of the present disclosure. For positive photoresist, the first and second photoresist reserving areas 222, 224 form opaque areas, the photoresist completely removing areas 223 form light-transmitting areas and the photoresist partially removing areas 221 form semitransparent areas (while for negative photoresist, the first and second photoresist reserving areas 222, 224 form light-transmitting areas, the photoresist completely removing areas 223 form opaque areas and the photoresist partially removing areas 221 form semitransparent areas). The opaque areas correspond to the etching blocking layer 5 (i.e., a portion of a semiconductor protection layer), and the semitransparent areas correspond to the contact parts 41 of the source electrode 6 and the drain electrode 7 that contact with the semiconductor layer 4, as shown in FIG. 4. The light-transmitting areas are only distributed around the TFTs 50 and in separation zones the pixel areas 31, and a large light-transmitting area is located adjacent to the semitransparent areas. As shown in FIG. 5, the etching blocking layer 5 and a semiconductor layer 4 in the totally exposed area are removed by an etching process. As shown in FIG. 6, an ashing process is performed to remove the photoresist in the partially exposed area. As shown in FIG. 7, then, another etching process is performed to remove the etching blocking layer 5 in the partially exposed area, thereby forming the contact parts 41 of the source electrode 6 and the drain electrode 7 that contact with the semiconductor layer 4.

Figure 8:
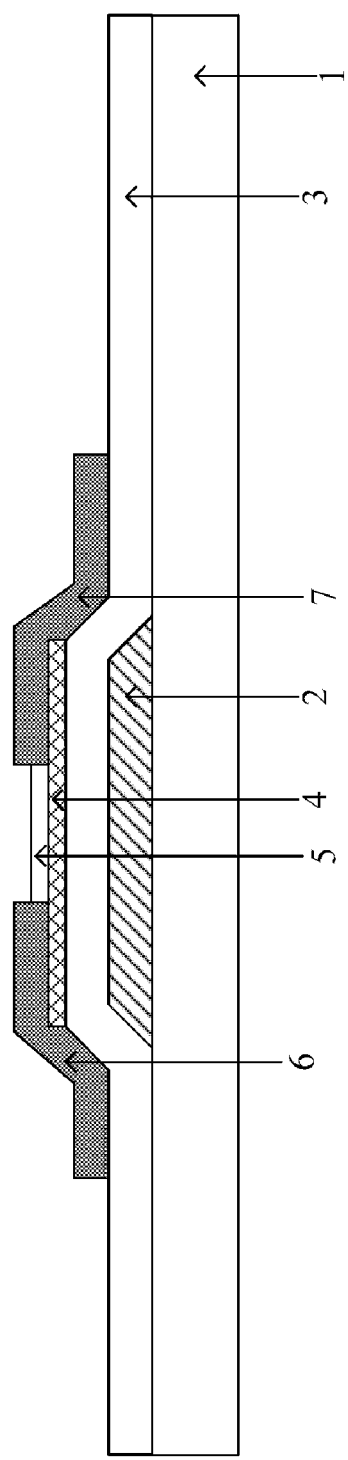
FIG. 8 is a sectional view taken along the line AB in FIG. 2, showing an array substrate after a third photolithography process according to an embodiment of the present disclosure taken along the line AB in FIG. 2.

In Step 3, as shown in FIG. 3, a metal film of the source electrode 6 and the drain electrode 7 having a thickness of approximate 2000~10000 Å is deposited on the substrate 1 through a thermal evaporation or sputtering process after the Step 2 is completed. Metal or alloy such as Cr, W, Cu, Ti, Ta and Mo may be used for forming the metal film. A metal layer made of a plurality of layers of metals is also conceivable. The source electrode 6, the drain electrode 7 and a data line 32 (FIG. 2) are formed through a conventional photolithography process, as shown in FIG. 8.

Figure 9:
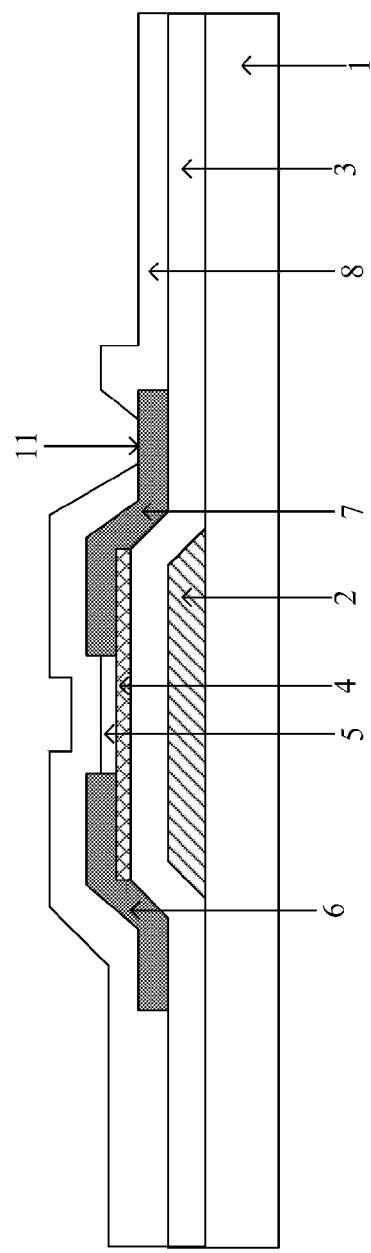
FIG. 9 is a sectional view taken along the line AB in FIG. 2, showing an array substrate after a fourth photolithography process according to an embodiment of the present disclosure, taken along the line AB in FIG. 2.

In Step 4, as shown in FIG. 9, a metal oxide protection layer 8 having a thickness of approximate 500~3000 Å is deposited on the substrate 1 through a PECVD process after the Step 3. The metal oxide protection layer 8 may be a single layer of silicon oxide, a composite structure of silicon nitride and silicon oxide, or a triple-layer structure of silicon nitride/silicon oxynitride/silicon oxide. $N_2O$, $SiH_4$; $N_2O$, $SiH_4$, $NH_3$, $N_2$; $SiH_4$, $NH_3$, $N_2$或 $SiH_2Cl_2$ are used as the reacting gas to create silicon nitride, silicon oxynitride, or silicon oxide. Contact areas between the light-transmitting pixel electrode and the drain electrode, (i.e., a contact through hole 11 of the light-transmitting pixel electrode and the drain electrode) is formed through a conventional photolithography process, as shown in FIG. 9.

In Step 5, as shown in FIG. 10, a light-transmitting conductive layer having a thickness of approximate 300~1500 Å is deposited on the substrate 1 through a thermal evaporation or sputtering process after Step 4. The light-transmitting conductive layer may be ITO or IZO, or other light-transmitting metal oxides. The light-transmitting pixel electrode 9 is formed through a single photolithography process, as shown in FIG. 8.

As described above, according to the embodiments of present disclosure, there is provided a mask for manufacturing metal oxide TFTs of the pixel areas of an array substrate and a method for manufacturing TFTs of the pixel areas of the array substrate using the mask. The profile of the part of photoresist corresponding to the photoresist partially removing areas after exposure and development is improved.

The above embodiment are only to illustrate rather than to limit the present disclosure, it would be appreciated by those skilled in the art that various changes or modifications may be made in these embodiments without departing from the principles and spirit of the disclosure, and thus all equivalent technical solutions shall fall within the scope of the present disclosure. The scope of the present disclosure should be defined in the claims and their equivalents.

What is claimed is:

1. A mask, comprising a mask body, the mask body having a pattern area, wherein, the pattern area comprises:
    a photoresist partially removing area for removing photoresist partially;
    a photoresist completely removing area for removing photoresist completely; and
    a first photoresist reserving area located between the photoresist partially removing area and the photoresist completely removing area and adjoining the photoresist partially removing area and the photoresist completely removing area for reserving photoresist, the first photoresist reserving area being designed to adjust a profile of a part of the photoresist corresponding to the photoresist partially removing area after exposure and development.

2. The mask according to claim 1, wherein, the pattern area further comprises a second photoresist reserving area, and the photoresist partially removing area is arranged between the first and second photoresist reserving areas.

3. The mask according to claim 1, wherein, the pattern area comprises two photoresist partially removing areas, two first photoresist reserving areas, and two photoresist completely removing areas,
    the pattern area further comprises a second photoresist reserving area, and
    the two photoresist completely removing areas, the two first photoresist reserving areas, the two photoresist partially removing areas and the second photoresist reserving area are arranged in a row in an order of one of the two photoresist completely removing areas, one of the two first photoresist reserving areas, one of the two photoresist partially removing areas, the second photoresist reserving area, the other of the two photoresist partially removing areas, the other of the two first photoresist reserving areas, and the other of the two photoresist completely removing areas.

4. The mask according to claim 1, wherein,
    the pattern area of the mask is configured to form a thin film transistor of a pixel area of an array substrate, and
    the thin film transistor comprises a metal oxide semiconductor layer, a source electrode and a drain electrode; and
    the metal oxide semiconductor layer has contact parts for contacting a part of the source electrode and a part of the drain electrode respectively,
    wherein,
    the photoresist partially removing areas correspond to the contact parts, and the photoresist completely removing areas and the first photoresist reserving areas correspond to at least a part of an area around the thin film transistor of each pixel area of the array substrate; or
    the photoresist partially removing areas and the first photoresist reserving areas correspond to the contact parts, and the photoresist completely removing areas correspond to at least a part of an area around the thin film transistor of each pixel area of the array substrate; or
    the photoresist partially removing areas and parts of adjacent first photoresist reserving areas correspond to the contact parts, and the photoresist completely removing areas and the rest of the adjacent first photoresist reserving areas correspond to at least a part of an area around the thin film transistor of each pixel area of the array substrate.

5. The mask according to claim 3, wherein,
    the pattern area of the mask is configured to form a thin film transistor of a pixel area of an array substrate, and
    the thin film transistor comprises:
        a source electrode and a drain electrode;
        a metal oxide semiconductor layer having contact parts for contacting a part of the source electrode and a part of the drain electrode respectively, and
        an etching blocking layer located in a channel area between the source electrode and on the metal oxide semiconductor layer,
    wherein the second photoresist reserving area corresponds to the etching blocking layer of the thin film transistor of the array substrate,
    and wherein,
    the photoresist partially removing areas correspond to the contact parts, and the photoresist completely removing areas and the first photoresist reserving areas correspond to at least a part of an area around the thin film transistor of each pixel area of the array substrate; or
    the photoresist partially removing areas and the first photoresist reserving areas correspond to the contact parts, and the photoresist completely removing areas correspond to at least a part of an area around the thin film transistor of each pixel area of the array substrate; or
    the photoresist partially removing areas and parts of adjacent first photoresist reserving areas correspond to the contact parts, and the photoresist completely removing areas and the rest of the adjacent first photoresist reserving areas correspond to at least a part of an area around the thin film transistor of each pixel area of the array substrate.

6. The mask according to claim 1, wherein, the first photoresist reserving area has a length of 0.5-6 μm.

7. The mask according to claim 1, wherein, the first photoresist reserving area has a length of 1-3 μm.

8. The mask according to claim 1, wherein, the first photoresist reserving area has a transmittance which substantially equals to that of the second photoresist reserving area.

9. The mask according to claim 1, wherein, the photoresist completely removing area has a length which is at least 20 times of the length of the first photoresist reserving area.

10. The mask according to claim 1, wherein, the first photoresist reserving area is designed such that a difference between a dimension of a part of photoresist which corresponds to the photoresist partially removing area after exposure and development and a designed dimension is less than a predetermined value, and/or a difference between a position of the part of photoresist which corresponds to the photoresist partially removing area after exposure and development and a designed position is less than a predetermined value.

11. The mask according to claim 1, wherein, the first photoresist reserving area is designed such that a part of photoresist which corresponds to the photoresist partially removing area after exposure and development meets a predetermined dimensional tolerance, a predetermined profile tolerance and/or a predetermined position tolerance.

12. The mask according to claim 1, wherein, the photoresist is positive photoresist, the first photoresist reserving areas form opaque areas, the photoresist completely removing area forms a light-transmitting area and the photoresist partially removing area forms a semitransparent area.

13. The mask according to claim 2, wherein, the photoresist is positive photoresist, the first and second photoresist reserving areas form opaque areas, the photoresist completely removing area forms a light-transmitting area and the photoresist partially removing area forms a semitransparent area.

14. The mask according to claim 1, wherein, the photoresist is positive, and the first photoresist reserving area has a transmittance which is less than or equals to 10%.

15. A method for manufacturing thin film transistors of pixel areas of an array substrate using the mask according to claim 2, comprising steps of:

forming a layer of photoresist on a plurality of layers for creating a thin film transistor, the plurality of layers comprising a metal oxide semiconductor layer and an etching blocking layer provided on it, and exposing the photoresist layer with the mask, wherein the second photoresist reserving area corresponds to the etching blocking layer of the thin film transistors of the array substrate, and wherein the photoresist partially removing area corresponds to the contact parts, and the photoresist completely removing area and the first photoresist reserving area correspond to at least a part of an area around the thin film transistor of each pixel area of the array substrate; or the photoresist partially removing area and the first photoresist reserving area correspond to the contact parts, and the photoresist completely removing area corresponds to at least a part of an area around the thin film transistor of each pixel area of the array substrate; or the photoresist partially removing area and a part of adjacent first photoresist reserving area correspond to the contact parts, and the photoresist completely removing area and the rest of the adjacent first photoresist reserving area correspond to at least a part of an area around the thin film transistor of each pixel area of the array substrate.

* * * * *